United States Patent
Paek et al.

(10) Patent No.: US 12,555,504 B2
(45) Date of Patent: Feb. 17, 2026

(54) DISPLAY DEVICE AND METHOD OF MANUFACTURING THE SAME

(71) Applicant: LG Display Co., Ltd., Seoul (KR)

(72) Inventors: SeungHan Paek, Seoul (KR); SangPyo Hong, Goyang-si (KR); HyunJin An, Paju-si (KR); Kyungjae Yoon, Seoul (KR); Jeonphill Han, Goyang-si (KR)

(73) Assignee: LG Display Co., Ltd (KR)

( * ) Notice: Subject to any disclaimer, the term of this patent is extended or adjusted under 35 U.S.C. 154(b) by 307 days.

(21) Appl. No.: 18/210,359

(22) Filed: Jun. 15, 2023

(65) Prior Publication Data

US 2024/0177639 A1 May 30, 2024

(30) Foreign Application Priority Data

Nov. 30, 2022 (KR) .......................... 10-2022-0164159

(51) Int. Cl.
*G09G 3/00* (2006.01)
*H10H 20/01* (2025.01)

(52) U.S. Cl.
CPC .......... *G09G 3/006* (2013.01); *H10H 20/018* (2025.01)

(58) Field of Classification Search
CPC ...... G09G 3/006; H10H 20/018; H10K 77/10; H10K 59/124; H10K 71/851; H10K 59/80; H10K 59/12; H10K 59/1201; H10K 71/00; G09F 9/33
USPC ......................................... 324/537, 500, 538
See application file for complete search history.

(56) References Cited

U.S. PATENT DOCUMENTS

| | | | |
|---|---|---|---|
| 11,455,053 B2* | 9/2022 | Kim | G06F 3/0416 |
| 12,232,407 B2* | 2/2025 | Kwak | H10K 71/00 |
| 2017/0359899 A1 | 12/2017 | Heo et al. | |
| 2018/0158894 A1* | 6/2018 | Park | H10K 71/70 |
| 2019/0229066 A1 | 7/2019 | Chang et al. | |
| 2020/0125314 A1* | 4/2020 | Cho | H10D 1/47 |
| 2020/0235329 A1 | 7/2020 | Tian et al. | |
| 2022/0052240 A1 | 2/2022 | Jang et al. | |
| 2022/0068830 A1 | 3/2022 | Lee et al. | |

(Continued)

FOREIGN PATENT DOCUMENTS

| | | |
|---|---|---|
| CN | 101520577 A | 9/2009 |
| CN | 102844703 A | 12/2012 |

(Continued)

OTHER PUBLICATIONS

Taiwanese Office Action dated Aug. 2, 2024 issued in Patent Application No. 112121643 w/English Translation (7 pages).

(Continued)

*Primary Examiner* — Giovanni Astacio-Oquendo
(74) *Attorney, Agent, or Firm* — Fish & Richardson P.C.

(57) ABSTRACT

A display device includes a substrate including an active area and a non-active area; an organic insulating layer disposed on the substrate and having a portion thereof protruding outward from the substrate; a plurality of alignment patterns disposed between the substrate and the organic insulating layer in the non-active area; and a plurality of alignment grooves disposed in a lower surface of the portion of the organic insulating layer, protruding outward from the substrate, thus easily detecting a position of an edge of the substrate from the plurality of alignment patterns disposed adjacent to the edge of the substrate.

20 Claims, 7 Drawing Sheets

(56) References Cited

U.S. PATENT DOCUMENTS

| | | | |
|---|---|---|---|
| 2022/0137738 A1* | 5/2022 | Kim | G06F 3/0443 345/174 |
| 2022/0173050 A1 | 6/2022 | Yao et al. | |
| 2022/0173207 A1 | 6/2022 | Lee | |
| 2022/0246894 A1 | 8/2022 | Han et al. | |
| 2022/0254962 A1 | 8/2022 | Miller et al. | |
| 2022/0315481 A1 | 10/2022 | Roh et al. | |
| 2023/0165054 A1 | 5/2023 | Lee et al. | |
| 2025/0203760 A1* | 6/2025 | Lee | H10K 59/90 |

FOREIGN PATENT DOCUMENTS

| | | |
|---|---|---|
| CN | 113540173 A | 10/2021 |
| CN | 114299824 A | 4/2022 |
| JP | H 11-344715 A | 12/1999 |
| JP | H 11-352469 A | 12/1999 |
| JP | 2006-047380 A | 2/2006 |
| JP | 2017-111290 A | 6/2017 |
| KR | 2003-0097144 A | 12/2003 |
| KR | 10-2007-0016483 A | 2/2007 |
| KR | 10-1019831 B1 | 3/2011 |
| KR | 10-2014-0068655 A | 6/2014 |
| KR | 10-2021-0157939 A | 12/2021 |
| WO | 2021/182679 A1 | 9/2021 |

OTHER PUBLICATIONS

Japanese Office Action dated Jan. 9, 2024 issued in Patent Application No. 2023-096706 Translation (11 pages).

Japanese Office Notice of Allowance dated Apr. 2, 2024 issued in Patent Application No. 2023-096706 Translation (6 pages).

Extended European Search Report dated Apr. 24, 2024 issued in Patent Application No. 23179213.6 (10 pages).

* cited by examiner

DISPLAY DEVICE AND METHOD OF MANUFACTURING THE SAME

CROSS-REFERENCE TO RELATED APPLICATION

This application claims the priority of Korean Patent Application No. 10-2022-0164159 filed on Nov. 30, 2022, which is hereby incorporated by reference in its entirety.

BACKGROUND

Field of the Disclosure

The present disclosure relates to a display device and a method of manufacturing the display device, and more particularly, to a display device capable of easily monitoring a state of an etched substrate and a method of manufacturing the display device.

Description of the Background

Display devices used in computer monitors, TVs, and mobile phones include organic light emitting displays (OLEDs) that emit light by themselves, liquid crystal displays (LCDs) that require a separate light source, and the like.

Display devices are being applied to more fields of application including not only computer monitors and TVs, but also personal mobile devices, and thus, display devices having a reduced volume and weight while having a wide active area are being studied.

Meanwhile, a manufacturing process of display devices is not performed on substrates corresponding to the display devices, from the beginning. After performing the manufacturing process thereof on a mother substrate, the mother substrate is physically cut into a plurality of pieces using a laser or a wheel, so that a plurality of display devices may be formed. However, when the mother substrate is formed of glass, a separate grinding process is required to smooth a cut surface due to the occurrence of micro-cracks or glass fragments on the cut surface.

SUMMARY

Accordingly, the present disclosure is directed to a display device and a method of manufacturing the display device that substantially obviate one or more of problems due to limitations and disadvantages described above.

More specifically, the present disclosure is to provide a display device capable of easily monitoring a position of an edge of an etched substrate, and a method of manufacturing the display device.

The present disclosure is also to provide a display device capable of simply monitoring an etching range of a mother substrate with the naked eye and a method of manufacturing the display device.

The present disclosure is yet to provide a display device capable of etching a substrate in various shapes and a method of manufacturing the display device.

Further, the present disclosure is to provide a display device including a substrate having improved rigidity and a method of manufacturing the display device.

The present disclosure is not limited to the above-mentioned features, which are not mentioned above, may be clearly understood by those skilled in the art from the following descriptions.

To achieve these and other advantages and in accordance with the present disclosure, as embodied and broadly described, a display device includes a substrate including an active area and a non-active area; an organic insulating layer disposed on the substrate and having a portion thereof protruding outward from the substrate; a plurality of alignment patterns disposed between the substrate and the organic insulating layer in the non-active area; and a plurality of alignment grooves disposed in a lower surface of the portion of the organic insulating layer, protruding outward from the substrate. Accordingly, according to the present disclosure, a position of an edge of the substrate may be easily detected from the plurality of alignment patterns disposed adjacent to the edge of the substrate.

In another aspect of the present disclosure, a method of manufacturing a display device includes forming a plurality of alignment patterns to be adjacent to scribing lines on a mother substrate; forming an organic insulating layer covering the plurality of alignment patterns; and etching the mother substrate along the scribing lines with an etchant, wherein the etching of the mother substrate includes etching the mother substrate and a portion of the plurality of alignment patterns together. Accordingly, according to the present disclosure, an etching range of the mother substrate may be monitored from the alignment patterns remaining without being etched after an etching process of the mother substrate.

In a further aspect of the present disclosure, a display device includes a substrate having at least one round shape edge and including an active area and a non-active area; at least one organic insulating layer disposed on the substrate and having a protruding portion to an outside edge of the substrate; a plurality of alignment patterns disposed at an inside edge of the substrate; and a plurality of alignment grooves disposed in a surface of the protruding portion in close proximity to the substrate; and a side coating layer surrounding the substrate and filled in the plurality of alignment grooves.

According to the present disclosure, it is possible to easily monitor a position of an edge of a substrate with the naked eye.

According to the present disclosure, a plurality of display devices may be easily formed from a mother substrate by monitoring an etching range of a mother substrate.

According to the present disclosure, as a substrate is etched in a chemical method, micro-cracks or fragments may be minimized on a cut surface of the substrate, and rigidity of the substrate may be improved.

According to the present disclosure, a substrate may be easily formed in various shapes.

The effects according to the present disclosure are not limited to the contents exemplified above, and more various effects are included in the present specification.

BRIEF DESCRIPTION OF THE DRAWINGS

The accompanying drawings, which are included to provide a further understanding of the disclosure and are incorporated in and constitute a part of the disclosure, illustrate aspects of the disclosure and together with the description serve to explain the principle of the disclosure.

In the drawings.

DETAILED DESCRIPTION

Figure 1:
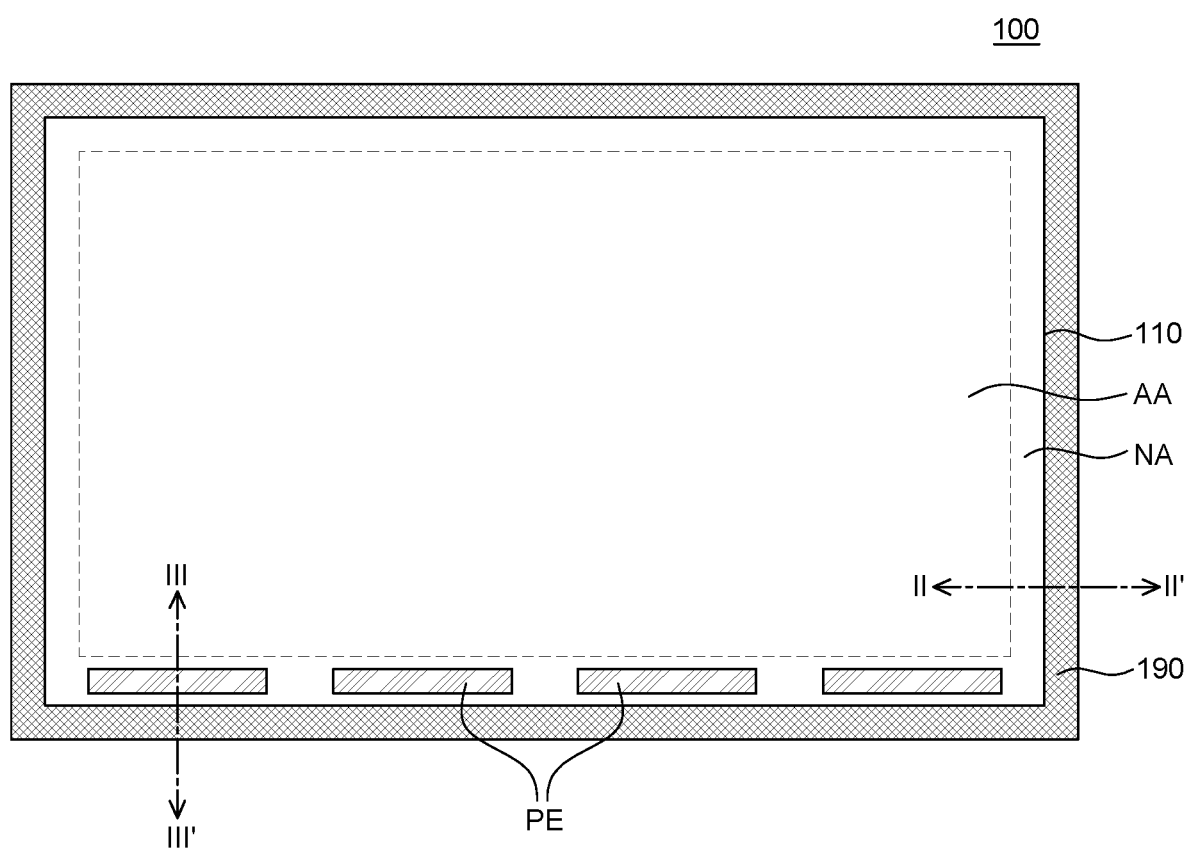
FIG. 1 is a plan view of a display device according to an exemplary aspect of the present disclosure.

Advantages and characteristics of the present disclosure and a method of achieving the advantages and characteristics will be clear by referring to exemplary aspects described below in detail together with the accompanying drawings. However, the present disclosure is not limited to the exemplary aspects disclosed herein but will be implemented in various forms. The exemplary aspects are provided by way of example only so that those skilled in the art may fully understand the disclosures of the present disclosure and the scope of the present disclosure.

The shapes, sizes, ratios, angles, numbers, and the like illustrated in the accompanying drawings for describing the exemplary aspects of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various aspects of the present disclosure may be partially or entirely adhered to or combined with each other and may be interlocked and operated in technically various ways, and the aspects may be carried out independently of or in association with each other.

Hereinafter, a display device according to exemplary aspects of the present disclosure will be described in detail with reference to accompanying drawings.

Figure 2:
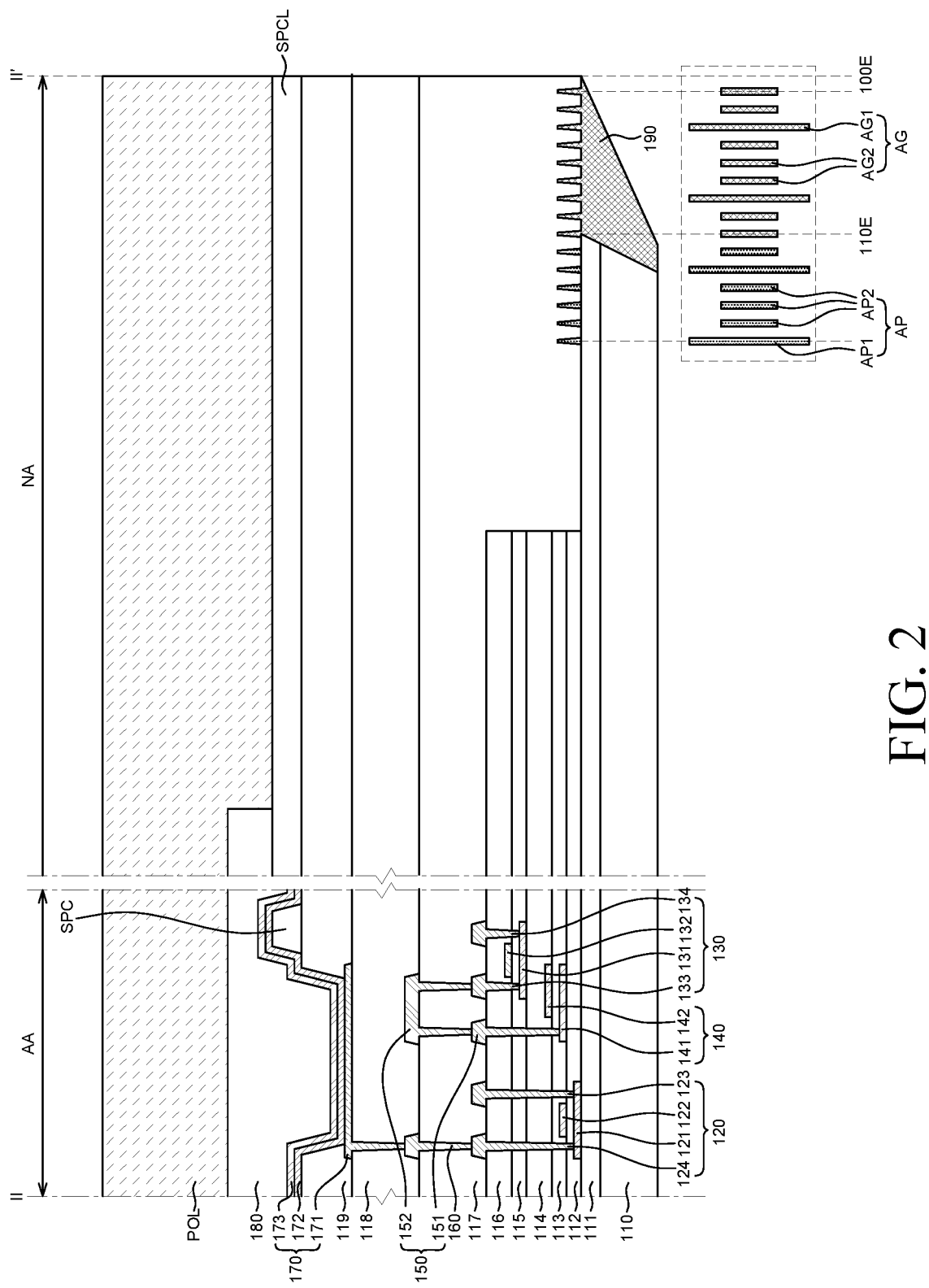
FIG. 2 is a cross-sectional view taken along II-II' of FIG. 1.
Figure 3:
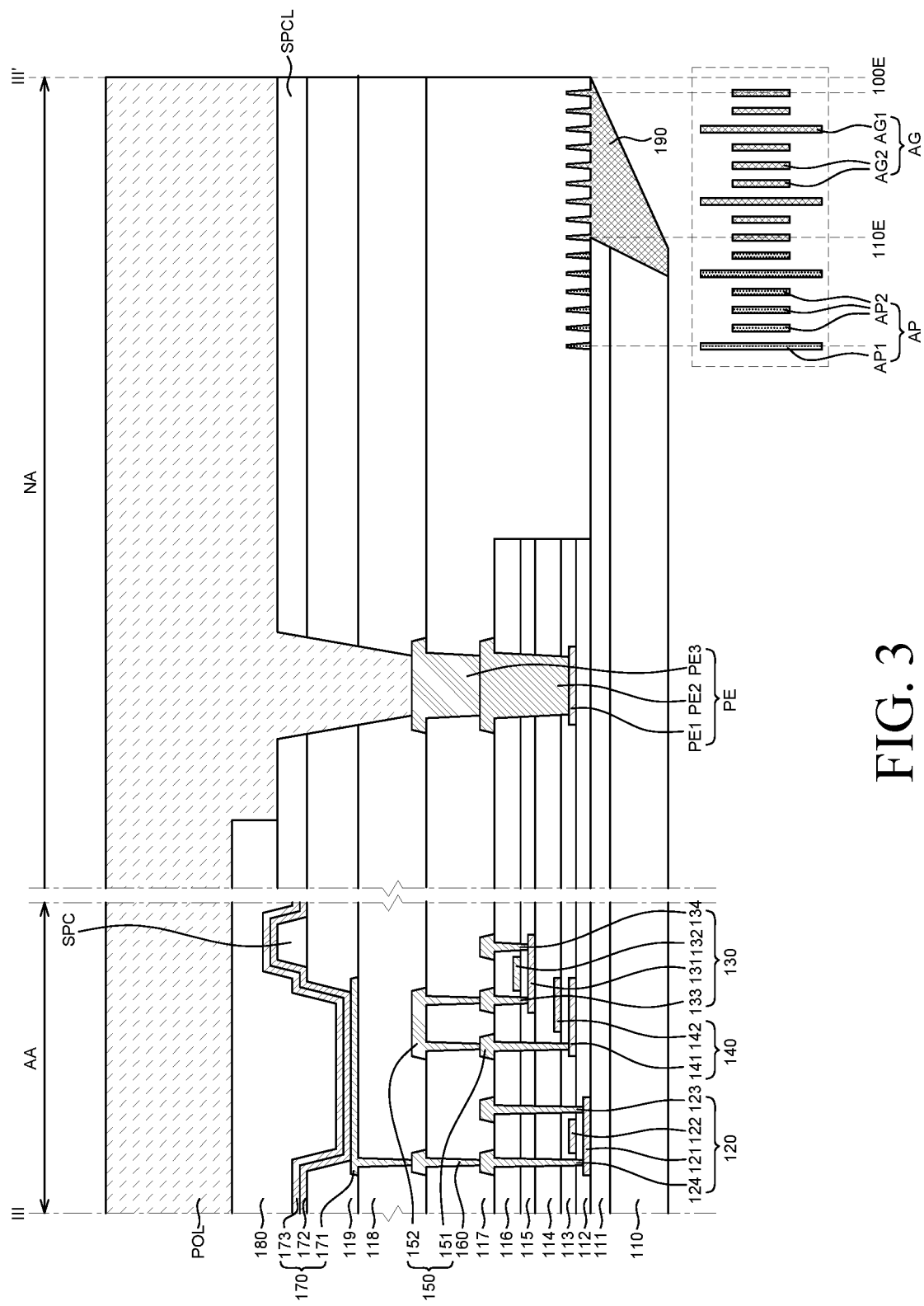
FIG. 3 is a cross-sectional view taken along III-III' of FIG. 1.

FIG. 1 is a plan view of a display device according to an exemplary aspect of the present disclosure. FIG. 2 is a cross-sectional view taken along II-II' of FIG. 1. FIG. 3 is a cross-sectional view taken along III-III' of FIG. 1.

Referring to FIGS. 1 and 2, a display device 100 according to an exemplary aspect of the present disclosure includes a substrate 110, a first buffer layer 111, a first gate insulating layer 112, a first interlayer insulating layer 113, a second buffer layer 114, a second gate insulating layer 115, a second interlayer insulating layer 116, a first planarization layer 117, a second planarization layer 118, banks 119, a spacer layer SPCL, a spacer SPC, a first transistor 120, a second transistor 130, a storage capacitor 140, connection electrodes 150, an auxiliary electrode 160, light emitting elements 170, pad electrodes PE, an encapsulation layer 180, a side coating layer 190, a polarizing plate POL, alignment patterns AP, and alignment grooves AG.

Initially, referring to FIG. 1, the substrate 110 supports various components included in the display device 100 and may be formed of an insulating material. For example, the substrate 110 may be formed of glass.

The substrate 110 includes an active area AA and a non-active area NA.

The active area AA is an area where an image is displayed on the display device 100. A plurality of sub-pixels constituting a plurality of pixels and circuits for driving the plurality of sub-pixels may be disposed in the active area AA. The plurality of sub-pixels are minimum units constituting the active area AA, and a display element may be disposed in each of the plurality of sub-pixels. For example, the light emitting element 170 including an anode 171, a light emitting layer 172, and a cathode 173 as the display element may be disposed in each of the plurality of sub-pixels, but is not limited thereto. In addition, the circuits for driving the plurality of sub-pixels may include driving elements and lines. For example, the circuit may include the transistors, the storage capacitor, scan lines, and data lines, but the present disclosure is not limited thereto.

The non-active area NA is an area in which an image is not displayed. In the non-active area NA, various lines and circuits for driving the light emitting elements 170 of the active area AA are disposed. For example, in the non-active area NA, link lines for transferring signals to the plurality of sub-pixels and circuits of the active area AA or driver ICs such as gate driver ICs and data driver ICs may be disposed, but the present disclosure is not limited thereto.

A plurality of the pad electrodes PE are disposed in the non-active area NA. The plurality of pad electrodes PE may be electrically connected to driving components such as a printed circuit board and flexible films and transmit various signals to the plurality of sub-pixels of the active area AA. In this case, the plurality of pad electrodes PE may be electrically connected to various signal lines connected to the plurality of sub-pixels, such as the scan lines or data lines. Although FIG. 1 illustrates that four pad electrodes PE are disposed in the non-active area NA located at a lower side, the number and positions of the pad electrodes PE are not limited thereto.

The side coating layer 190 that surrounds the substrate 110 is disposed. The side coating layer 190 may be disposed to cover an inside edge 110E of the substrate 110. The side coating layer 190 may cover an outer portion of the display device 100 exposed from the substrate 110. During an etching process of the substrate 110, an organic insulating layer disposed on an upper portion of the substrate 110 may be exposed from the substrate 110, and the side coating layer 190 may cover the organic insulating layer exposed from the substrate 110 to protect the outer portion of the display device 100 and may minimize penetration of moisture or oxygen into the display device 100.

Referring to FIG. 2, the first buffer layer 111 is disposed on the substrate 110. The first buffer layer 111 may minimize diffusion of moisture or impurities from the substrate 110. The first buffer layer 111 may be formed of a single layer or multiple layers of silicon oxide (SiOx) or silicon nitride (SiNx), but is not limited thereto.

A plurality of the transistors are disposed in each of the plurality of sub-pixels on the first buffer layer 111. The plurality of transistors include the first transistor 120 and the second transistor 130.

The plurality of transistors may be formed of different types of transistors. For example, one of the plurality of transistors may be a transistor using an oxide semiconductor as an active layer. An oxide semiconductor material is suitable for a switching transistor that maintains a short turn-on time and a long turn-off time due to its low off-current.

For example, another one of the plurality of transistors may be a transistor having low temperature poly-silicon (LTPS) as an active layer. A polysilicon material may be suitable for a driving transistor because it has high mobility, low power consumption, and excellent reliability.

Meanwhile, the plurality of transistors may be N-type transistors or P-type transistors. Since carriers are electrons in the N-type transistor, the electrons may flow from a source electrode to a drain electrode, and current may flow from the drain electrode to the source electrode. Since carriers are holes in the P-type transistor, the holes may flow from a source electrode to a drain electrode, and current may flow from the source electrode to the drain electrode. For example, one of the plurality of transistors may be an N-type transistor, and the other of the plurality of transistors may be a P-type transistor.

First, the first transistor 120 is disposed on the first buffer layer 111. The first transistor 120 includes a first active layer 121, a first gate electrode 122, a first source electrode 123, and a first drain electrode 124.

Specifically, the first active layer 121 is disposed on the first buffer layer 111. The first active layer 121 may be formed of, for example, an oxide semiconductor, amorphous silicon, or polysilicon, but is not limited thereto.

The first gate insulating layer 112 is disposed on the first active layer 121. The first gate insulating layer 112 is an insulating layer for insulating the first active layer 121 and the first gate electrode 122, and may be formed of a single layer or multiple layers of silicon oxide (SiOx) or silicon nitride (SiNx), but the present disclosure is not limited thereto.

The first gate electrode 122 is disposed on the first gate insulating layer 112. The first gate electrode 122 may be formed of a conductive material, such as copper (Cu), aluminum (Al), molybdenum (Mo), nickel (Ni), titanium (Ti), and chromium (Cr), or an alloy thereof, but is not limited thereto.

The first interlayer insulating layer 113, the second buffer layer 114, the second gate insulating layer 115, and the second interlayer insulating layer 116 are disposed on the first gate electrode 122.

The first interlayer insulating layer 113 is an insulating layer for protecting components under the first interlayer insulating layer 113, and may be formed of a single layer or multiple layers of silicon oxide (SiOx) or silicon nitride (SiNx), but the present disclosure is not limited thereto.

The second buffer layer 114 disposed on the first interlayer insulating layer 113 may be formed of a single layer or multiple layers of silicon oxide (SiOx) or silicon nitride (SiNx), but the present disclosure is not limited thereto.

The second gate insulating layer 115 is disposed on the second buffer layer 114. The second gate insulating layer 115 is an insulating layer for insulating the second active layer 131 and the second gate electrode 132 of the second transistor 130 to be described later. The second gate insulating layer 115 may be formed of a single layer or multi-layers of silicon oxide (SiOx) or silicon nitride (SiNx), but is not limited thereto.

The second interlayer insulating layer 116 is disposed on the second gate insulating layer 115. The second interlayer insulating layer 116 is an insulating layer for protecting components under the second interlayer insulating layer 116, and may be formed of a single layer or multiple layers of silicon oxide (SiOx) or silicon nitride (SiNx), but the present disclosure is not limited thereto.

The first source electrode 123 and the first drain electrode 124 are disposed on the second interlayer insulating layer 116 to be spaced apart from each other. The first source electrode 123 and the first drain electrode 124 may be electrically connected to the first active layer 121 through contact holes formed in the second interlayer insulating layer 116, the second gate insulating layer 115, the second buffer layer 114, the first interlayer insulating layer 113, and the first gate insulating layer 112. The first source electrode 123 and the first drain electrode 124 may be formed of a conductive material, such as copper (Cu), aluminum (Al), molybdenum (Mo), and titanium (Ti), or an alloy thereof, but the present disclosure is not limited thereto.

Next, the second transistor 130 is disposed on the second buffer layer 114. The second transistor 130 includes a second active layer 131, a second gate electrode 132, a second source electrode 133, and a second drain electrode 134.

The second active layer 131 is disposed on the second buffer layer 114. The second active layer 131 may be formed of, for example, an oxide semiconductor, amorphous silicon, or polysilicon, but is not limited thereto.

The second gate insulating layer 115 is disposed on the second active layer 131, and the second gate electrode 132 is disposed on the second gate insulating layer 115. The second gate electrode 132 may be formed of a conductive material, such as copper (Cu), aluminum (Al), molybdenum (Mo), nickel (Ni), titanium (Ti), chromium (Cr), or an alloy thereof, but is not limited thereto.

The second interlayer insulating layer 116 is disposed on the second gate electrode 132, and the second source electrode 133 and the second drain electrode 134 are disposed on the second interlayer insulating layer 116 to be spaced apart from each other. The second source electrode 133 and the second drain electrode 134 may be electrically connected to the second active layer 131 through contact holes formed in the second Interlayer insulating layer 116 and the second gate insulating layer 115. The second source electrode 133 and the second drain electrode 134 may be formed of a conductive material, for example, copper (Cu), aluminum (Al), molybdenum (Mo), nickel (Ni), titanium (Ti), chromium (Cr) or an alloy thereof, but the present disclosure is not limited thereto.

The storage capacitor 140 is disposed on the first gate insulating layer 112. The storage capacitor 140 may store a certain voltage to maintain a constant voltage level of the gate electrode of the driving transistor while the light emitting element 170 emits light, and may supply a constant driving current to the light emitting element 170. The storage capacitor 140 includes a plurality of capacitor electrodes. The storage capacitor 140 includes a first capacitor electrode 141 and a second capacitor electrode 142.

First, the first capacitor electrode 141 is disposed on the first gate insulating layer 112. The first capacitor electrode 141 may be formed of a conductive material, such as copper (Cu), aluminum (Al), molybdenum (Mo), nickel (Ni), titanium (Ti), chromium (Cr), or an alloy thereof, but is not limited thereto.

The first interlayer insulating layer 113 is disposed on the first capacitor electrode 141, and the second capacitor electrode 142 overlapping with the first capacitor electrode 141 is disposed on the first interlayer insulating layer 113. The second capacitor electrode 142 may be formed of a conductive material, such as copper (Cu), aluminum (Al), molybdenum (Mo), nickel (Ni), titanium (Ti), chromium (Cr), or an alloy thereof, but is not limited thereto.

Next, the first planarization layer 117 is disposed on the first transistor 120, the second transistor 130 and the storage capacitor 140 in the active area AA and the non-active area NA. The first planarization layer 117 may planarize the upper portion of the substrate 110 above which the plurality of transistors 120 and 130 and the storage capacitor 140 are disposed. In addition, the first planarization layer 117 may be formed on an entire surface of the display device 100 and disposed even in the non-active area NA. The first planarization layer 117 may be formed of a single layer or multilayers, and may be formed of an organic insulating material. For example, the first planarization layer 117 may be formed of photoresist or an acryl-based organic material, but is not limited thereto.

The connection electrodes 150 are disposed on the second interlayer insulating layer 116. The connection electrodes 150 are electrodes for electrically connecting the storage capacitor 140 and the second transistor 130. The connection electrodes 150 include a first connection electrode 151 and a second connection electrode 152.

The first connection electrode 151 is disposed on the second interlayer insulating layer 116. The first connection electrode 151 may be connected to the first capacitor electrode 141 through contact holes formed in the second interlayer insulating layer 116, the second gate insulating layer 115, the second buffer layer 114, and the first interlayer insulating layer 113. The first connection electrode 151 may be formed of a conductive material, such as copper (Cu), aluminum (Al), molybdenum (Mo), nickel (Ni), titanium (Ti) and chromium (Cr), or an alloy thereof, but is not limited thereto.

The second connection electrode 152 is disposed on the first planarization layer 117. The second connection electrode 152 may be connected to the second source electrode 133 of the second transistor 130 and the first connection electrode 151 through contact holes formed in the first planarization layer 117 and the second interlayer insulating layer 116. Accordingly, the first capacitor electrode 141 of the storage capacitor 140 and the second source electrode 133 of the second transistor 130 may be electrically connected to each other through the second connection electrode 152 and the first connection electrode 151. The second connection electrode 152 may be formed of a conductive material, such as copper (Cu), aluminum (Al), molybdenum (Mo), nickel (Ni), titanium (Ti) and chromium (Cr), or an alloy thereof, but is not limited thereto.

The auxiliary electrode 160 is disposed on the first planarization layer 117. The auxiliary electrode 160 is an electrode for electrically connecting the first transistor 120 and the light emitting element 170. The auxiliary electrode 160 may be connected to the first drain electrode 124 of the first transistor 120 through a contact hole formed in the first planarization layer 117. The auxiliary electrode 160 may be formed of a conductive material, such as copper (Cu), aluminum (Al), molybdenum (Mo), nickel (Ni), titanium (Ti) and chromium (Cr), or an alloy thereof, but is not limited thereto.

The second planarization layer 118 is disposed on the auxiliary electrode 160 and the connection electrodes 150 in the active area AA and the non-active area NA. The second planarization layer 118 may planarize an upper portion of the active area AA in which the auxiliary electrode 160 and the connection electrodes 150 are formed. In addition, the second planarization layer 118 may be formed on the entire surface of the display device 100 and disposed even in the non-active area NA. The second planarization layer 118 may be formed of a single layer or multilayers, and may be formed of an organic insulating material. For example, the second planarization layer 118 may be formed of photoresist or an acryl-based organic material, but is not limited thereto.

The light emitting element 170 is disposed on the second planarization layer 118. The light emitting element 170 is a self-emitting element that emits light, and includes the anode 171, the light emitting layer 172 and the cathode 173.

The anode 171 may supply holes to the light emitting layer 172 and may be formed of a conductive material having a high work function. For example, the anode 171 may be formed of tin oxide (TO), indium tin oxide (ITO), indium zinc oxide (IZO), indium tin zinc oxide (ITZO) or the like, but is not limited thereto.

If the display device 100 is a top emission type in which light emitted from the light emitting element 170 travels upwardly of the light emitting element 170, a reflective layer may be further formed under the anode 171 to move the light upwardly.

The bank 119 is disposed on the anode 171 and the second planarization layer 118. In the active area AA, the bank 119 may be disposed to cover an edge of the anode 171. The bank 119 may be disposed at a boundary between the sub-pixels adjacent to each other and reduce color mixing of light emitted from the light emitting element 170 of each of the plurality of sub-pixels. Also, the bank 119 may be disposed not only in the active area AA but also in the non-active area NA to cover an entirety of the non-active area NA. The bank 119 may be formed of an organic insulating material, and for example, the bank 119 may be formed of polyimide, acryl, or benzocyclobutene (BCB)-based resin, but is not limited thereto.

The light emitting layer 172 is disposed on the anode 171 exposed from the bank 119. The light emitting layer 172 may emit light by receiving holes from the anode 171 and electrons from the cathode 173. The light emitting layer 172 may include a red light emitting layer, a green light emitting layer, a blue light emitting layer, and a white light emitting layer according to a color of light emitted from the light emitting layer 172.

The cathode 173 is disposed on the light emitting layer 172 and the bank 119. The cathode 173 may be disposed throughout the plurality of sub-pixels. That is, the light emitting elements 170 of the plurality of respective sub-pixels may share the cathode 173. The cathode 173 may be connected to a low potential power line to supply electrons to the light emitting layer 172, and may be formed of a conductive material having a low work function. For example, the cathode 173 may be formed of one or more selected from the group consisting of metals such as magnesium (Mg), silver (Ag), and aluminum (Al) and alloys thereof, but is not limited thereto.

If the display device 100 is a bottom emission type in which light emitted from the light emitting element 170 travels toward the substrate 110 that is below the light emitting element 170, the cathode 173 may be formed of a highly reflective metallic material to move the light toward the substrate 110.

The spacer SPC is disposed between the bank 119 and the light emitting layer 172. The spacer SPC may support a fine metal mask (FMM), which is a deposition mask used in forming the light emitting layer 172. Certain distances between the deposition mask and the bank 119 and between the deposition mask and the anode 171 may be maintained by the spacer SPC supporting the deposition mask, and damage due to contact of the deposition mask may be prevented. In this case, the spacer SPC may be formed in a shape in which a width thereof is narrower upwardly to minimize an area thereof in contact with the deposition mask. The spacer SPC may be formed of an organic insulating material, such as polyimide, acryl and benzocyclobutene (BCB)-based resin, but is not limited thereto.

The spacer layer SPCL is disposed on the bank 119 in the non-active area NA. The spacer layer SPCL of the non-active area NA and the spacer SPC of the active area AA may be formed of the same material on the same layer. The spacer layer SPCL may be disposed on the entirety of the non-active area NA to cover the bank 119.

The encapsulation layer 180 is disposed on the light emitting element 170 in an entirety of the active area AA and a portion of the non-active area NA. For example, the encapsulation layer 180 may cover the light emitting element 170 in the active area AA, and the encapsulation layer 180 may cover a portion of the spacer layer SPCL in the non-active area NA. The encapsulation layer 180 may seal the light emitting element 170 and protect the light emitting element 170 from external moisture, oxygen, impacts, and the like. The encapsulation layer 180 may be formed in various structures according to design.

For example, the encapsulation layer 180 may be formed by alternately stacking a plurality of inorganic layers and a plurality of organic layers. For example, the inorganic layer may be formed of an inorganic material, such as silicon nitride (SiNx), silicon oxide (SiOx), aluminum oxide (AlOx), or the like, and the organic layer may be formed of an epoxy-based or acrylic-based polymer. However, the present disclosure is not limited thereto. For another example, the encapsulation layer 180 may be formed of a metallic material having strong corrosion resistance and capable of being easily processed in the form of a foil or thin film, such as aluminum (Al), nickel (Ni), chromium (Cr), or an alloy material of iron (Fe) and nickel.

The polarizing plate POL is disposed on the encapsulation layer 180 in the active area AA and the non-active area NA. The polarizing plate POL may selectively transmit light and reduce reflection of external light incident on the display device 100. Specifically, in the display device 100, various metallic materials applied to semiconductor elements, lines, the light emitting elements 170, and the like are formed on the substrate 110. Accordingly, external light incident toward the substrate 110 may be reflected from the metallic material, and visibility of the display device 100 may be reduced due to the reflection of the external light. Accordingly, outdoor visibility of the display device 100 may be improved by disposing the polarizing plate POL that prevents the reflection of external light. However, the polarizing plate POL may be omitted according to an implementation example of the display device 100.

Referring to FIGS. 1 and 3 together, the plurality of pad electrodes PE are disposed in the non-active area NA. Each of the plurality of pad electrodes PE includes a first pad electrode PE1, a second pad electrode PE2, and a third pad electrode PE3.

First, the first pad electrode PE1 is disposed on the first gate insulating layer 112. The first pad electrode PE1 may be connected to various lines disposed in the active area AA to transmit signals from the flexible films or the printed circuit board to each of the plurality of sub-pixels. The first pad electrode PE1 may be formed of a conductive material, such as copper (Cu), aluminum (Al), molybdenum (Mo), nickel (Ni), titanium (Ti) and chromium (Cr), or an alloy thereof, but is not limited thereto.

The first interlayer insulating layer 113, the second buffer layer 114, the second gate insulating layer 115, and the second interlayer insulating layer 116 are disposed on the first pad electrode PE1, and the second pad electrode PE2 is disposed on the second interlayer insulating layer 116. The second pad electrode PE2 may be electrically connected to the first pad electrode PE1 through contact holes formed in the first interlayer insulating layer 113, the second buffer layer 114, the second gate insulating layer 115, and the second interlayer insulating layer 116. The second pad electrode PE2 may be formed of a conductive material, such as copper (Cu), aluminum (Al), molybdenum (Mo), nickel (Ni), titanium (Ti), chromium (Cr), or an alloy thereof, but is not limited thereto.

The first planarization layer 117 is disposed on the second pad electrode PE2, and the third pad electrode PE3 is disposed on the first planarization layer 117. The third pad electrode PE3 may be electrically connected to the second pad electrode PE2 through a contact hole of the first planarization layer 117. The third pad electrode PE3 may be electrically connected to driving components such as a plurality of flexible films through contact holes formed in the second planarization layer 118, the bank 119, and the spacer layer SPCL on the third pad electrode PE3. The third pad electrode PE3 may be formed of a conductive material, such as copper (Cu), aluminum (Al), molybdenum (Mo), nickel (Ni), titanium (Ti) and chromium (Cr), or an alloy thereof, but is not limited thereto.

In this case, to connect the pad electrodes PE to an external driving component, the polarizing plate POL may not be disposed in areas where the pad electrodes PE are disposed in the non-active area NA. Accordingly, the pad electrodes PE may be exposed to the outside and electrically connected to the driving component.

Meanwhile, in the non-active area NA, a majority of inorganic insulating layers formed of an inorganic insulating material may be disposed inside the substrate 110. Since some of the inorganic insulating layers are not mostly disposed in an area adjacent to an end portion of the substrate 110, edges of the some inorganic insulating layers may be disposed inside the inside edge 110E of the substrate 110. For example, the inorganic insulating layers may include the first buffer layer 111, the first gate insulating layer 112, the first interlayer insulating layer 113, the second buffer layer 114, the second gate insulating layer 115, and the second interlayer insulating layer 116. Among them, a majority of the inorganic insulating layers except for the first buffer layer 111 may be disposed only in a portion of the non-active area NA and may be disposed to be spaced apart from the inside edge 110E of the substrate 110. The inorganic insulating layer including silicon may be etched together with the substrate 110 by an etchant for the substrate 110 during the etching process of the substrate 110 formed of glass. Thus, the inorganic insulating layer and the end portion of the substrate 110 may be disposed to be spaced apart from each other such that the majority of the inorganic insulating layers is not exposed to the etchant.

In FIG. 2, it is illustrated that only the first buffer layer 111 among the plurality of inorganic insulating layers is disposed on entirety of the substrate 110, and the first buffer layer 111 and the inside edge 110E of the substrate 110 correspond to each other. However, the first buffer layer 111 may also be spaced apart from the inside edge 110E of the substrate 110 and disposed only inside the substrate 110, in the same manner as the remaining inorganic insulating layers. However, the present disclosure is not limited thereto.

In addition, the first planarization layer 117, the second planarization layer 118, the bank 119, and the spacer layer SPCL that are organic insulating layers formed of an organic insulating material, may be disposed to protrude outward from the substrate 110. Accordingly, the outside edge 100E of the display device 100 corresponds to edges of the first planarization layer 117, the second planarization layer 118, the bank 119, and the spacer layer SPCL, and the inside edge 110E of the substrate 110 may be disposed inside the outside edge 100E of the display device 100. The first planarization layer 117, the second planarization layer 118, the bank 119, and the spacer layer SPCL are organic insulating layers that are formed of an organic insulating material and may remain without being etched by the etchant for the substrate 110. In the process of etching the substrate 110, they may be formed to have a shape protruding from the inside edge 110E of the substrate 110. A more detailed description thereof will be described later with reference to FIGS. 4 to 6.

Next, the side coating layer 190 covering the inside edge 110E of the substrate 110 and the first planarization layer 117 that is exposed from the substrate 110 is disposed. The side coating layer 190 may be disposed to cover side surfaces of the substrate 110 and a lower surface of the first planarization layer 117 to protect the display device 100. The side coating layer 190 may be formed of an insulating material, for example, polyimide (PI), polyurethane, epoxy, or acrylic-based materials, but is not limited thereto.

In the non-active area NA, a plurality of the alignment patterns AP are disposed under the first planarization layer 117 to be spaced apart from each other at regular intervals. The plurality of alignment patterns AP are disposed between the first planarization layer 117 and the first buffer layer 111 in an area adjacent to the inside edge 110E of the substrate 110. The plurality of alignment patterns AP are patterns for monitoring a position of the inside edge 110E of the substrate 110 that is determined by an etching amount and the etching process of the substrate 110 when the substrate 110 is etched, and may function as a kind of scale. The position of the inside edge 110E of the substrate 110 may be confirmed by measuring an outermost alignment pattern AP among the plurality of alignment patterns AP.

In this case, the plurality of alignment patterns AP may be disposed parallel to the inside edge 110E of the substrate 110 so that the position of the inside edge 110E of the substrate 110 may be measured. For example, the plurality of alignment patterns AP are disposed parallel to the inside edge 110E of the substrate 110, and planar shapes of the plurality of respective alignment patterns AP may be a plurality of rectangular shapes that extend and elongate along the inside edge 110E of the substrate 110.

The plurality of alignment patterns AP includes a plurality of first alignment patterns AP1 and a plurality of second alignment patterns AP2. The plurality of second alignment patterns AP2 may be disposed between the plurality of respective first alignment patterns AP1. An interval between the plurality of first alignment patterns AP1 may be greater than an interval between the plurality of second alignment patterns AP2. Also, the plurality of first alignment patterns AP1 may have a length greater than that of the plurality of second alignment patterns AP2. An approximate position of the inside edge 110E of the substrate 110 may be measured through the plurality of first alignment patterns AP1, and a specific position of the inside edge 110E of the substrate 110 may be measured through the plurality of second alignment patterns AP2. For example, the plurality of first alignment patterns AP1 may display a scale of 10 units, and the plurality of second alignment patterns AP2 may display a scale of 1 unit. Accordingly, the approximate position of the inside edge 110E of the substrate 110 may be measured using the plurality of first alignment patterns AP1 having a relatively large interval, and the specific position of the inside edge 110E of the substrate 110 may be measured using the plurality of second alignment patterns AP2 having a relatively small interval. However, the number and intervals of the plurality of first alignment patterns AP1 and the plurality of second alignment patterns AP2 shown in the drawings are exemplary, and the number and intervals of the plurality of first alignment patterns AP1 and the plurality of second alignment patterns AP2 may be designed in various manners.

Also, the plurality of alignment patterns AP include target alignment patterns TAP. The target alignment pattern TAP is a pattern that overlaps with the position of the inside edge 110E of the substrate 110 that is actually designed, and an etching process is performed so that the target alignment pattern TAP and the inside edge 110E of the substrate 110 correspond to each other. Any one of the plurality of first alignment patterns AP1 and the plurality of second alignment patterns AP2 may be set as the target alignment patterns TAP. However, the present disclosure is not limited thereto, and alignment patterns AP having a shape different from those of the first alignment pattern AP1 and the second alignment pattern AP2 may be separately formed to distinguish the target alignment pattern TAP.

Meanwhile, during the etching process, an area within a predetermined distance from the target alignment pattern TAP may be set as a margin area due to a process error and the like. In this case, any one of the plurality of alignment patterns AP may function as a margin alignment pattern AP indicating a range of the margin area. For example, when an area ranging to an n-th alignment pattern AP and a minus (−) n-th alignment pattern AP from the target alignment pattern TAP is set as the margin area, some of the alignment patterns AP that are disposed in outermost sides of the margin area may be set as margin alignment patterns AP. Accordingly, it is possible to monitor the position of the inside edge 110E of the substrate 110 more specifically during the etching process using a pair of the margin alignment patterns AP and the target alignment pattern TAP between the pair of margin alignment patterns AP.

The plurality of alignment patterns AP may be formed of a material that may be etched together with the substrate 110 by the etchant for the substrate 110 when the substrate 110 formed of glass is etched, for example, an inorganic material and/or a metallic material. The plurality of alignment patterns AP may be formed of only an inorganic material or a metallic material, or may include both the inorganic material and the metallic material. For example, the substrate 110 formed of glass may be etched using an etchant in which hydrofluoric acid and nitric acid are mixed. In the case of using the etchant formed of hydrofluoric acid and nitric acid, the inorganic material or the metallic material may be etched, in addition to glass. Therefore, the plurality of alignment patterns AP may be formed of an inorganic material and/or a metallic material so that the plurality of alignment patterns AP may be etched together with the substrate by an etchant that etches glass.

For example, when the plurality of alignment patterns AP are formed of only an inorganic material, they may be formed in the same process and with the same material as any one of the inorganic insulating layers formed on the first buffer layer 111, or may be formed in a separate process. For another example, when the plurality of alignment patterns AP are formed of a metallic material, they may be formed in the same process and with the same material as various electrodes and lines formed on the substrate 110, or may be formed in a separate process. In addition, when the plurality of alignment patterns AP are formed of a metallic material, positions of the plurality of alignment patterns AP may be more easily confirmed with the naked eye using reflection characteristics of metallic patterns. However, the material of the plurality of alignment patterns AP is not limited, as long as it is a material that is etched by reacting with the etchant when etching the substrate 110 formed of glass, in addition to the inorganic material or the metallic material.

A plurality of alignment grooves AG are disposed in the lower surface of the first planarization layer 117. The plurality of alignment grooves AG are disposed between the first planarization layer 117 and the side coating layer 190. The side coating layer 190 may fill the plurality of alignment grooves AG. The plurality of alignment grooves AG may be grooves of the first planarization layer 117 formed by etching the substrate 110 and the plurality of alignment patterns AP together when the substrate 110 is etched. While the display device 100 is being manufactured, the plurality of alignment patterns AP are disposed in the plurality of respective alignment grooves AG, but some of the alignment patterns AP are removed during the etching process of the substrate 110, so the plurality of alignment grooves AG may be formed in the lower surface of the first planarization layer 117. When the etching of the substrate 110 is completed, the side coating layer 190 covering the first planarization layer 117 exposed from the substrate 110 may fill the plurality of alignment grooves AG.

The plurality of alignment grooves AG may be disposed parallel to the inside edge 110E of the substrate 110. For example, each of the plurality of alignment patterns AP may be disposed parallel to the inside edge 110E of the substrate 110, and a planar shape of each of the plurality of alignment grooves AG may be a rectangular shape that extends and elongates along the inside edge 110E of the substrate 110.

The plurality of alignment grooves AG include a plurality of first alignment grooves AG1 and a plurality of second alignment grooves AG2. The plurality of first alignment grooves AG1 are spaces in which the plurality of first alignment patterns AP1 are formed, and the plurality of second alignment grooves AG2 are spaces in which the plurality of second alignment patterns AP2 are formed. A shape of the side coating layer 190 filled in the plurality of first alignment grooves AG1 may correspond to those of the plurality of first alignment patterns AP1, and a shape of the side coating layer 190 filled in the plurality of second alignment grooves AG2 may correspond to the plurality of second alignment patterns AP2.

The plurality of second alignment grooves AG2 may be formed between the plurality of respective first alignment grooves AG1. Also, an interval between the plurality of first alignment grooves AG1 may be greater than an interval between the plurality of second alignment grooves AG2. Accordingly, planar shapes of the plurality of first alignment grooves AG1 may be identical to those of the plurality of first alignment patterns AP1, and planar shapes of the plurality of second alignment grooves AG2 may be identical to those of the plurality of second alignment patterns AP2.

Hereinafter, a method of manufacturing the display device 100 according to an exemplary aspect of the present disclosure will be described with reference to FIGS. 4 to 7.

Figure 4:
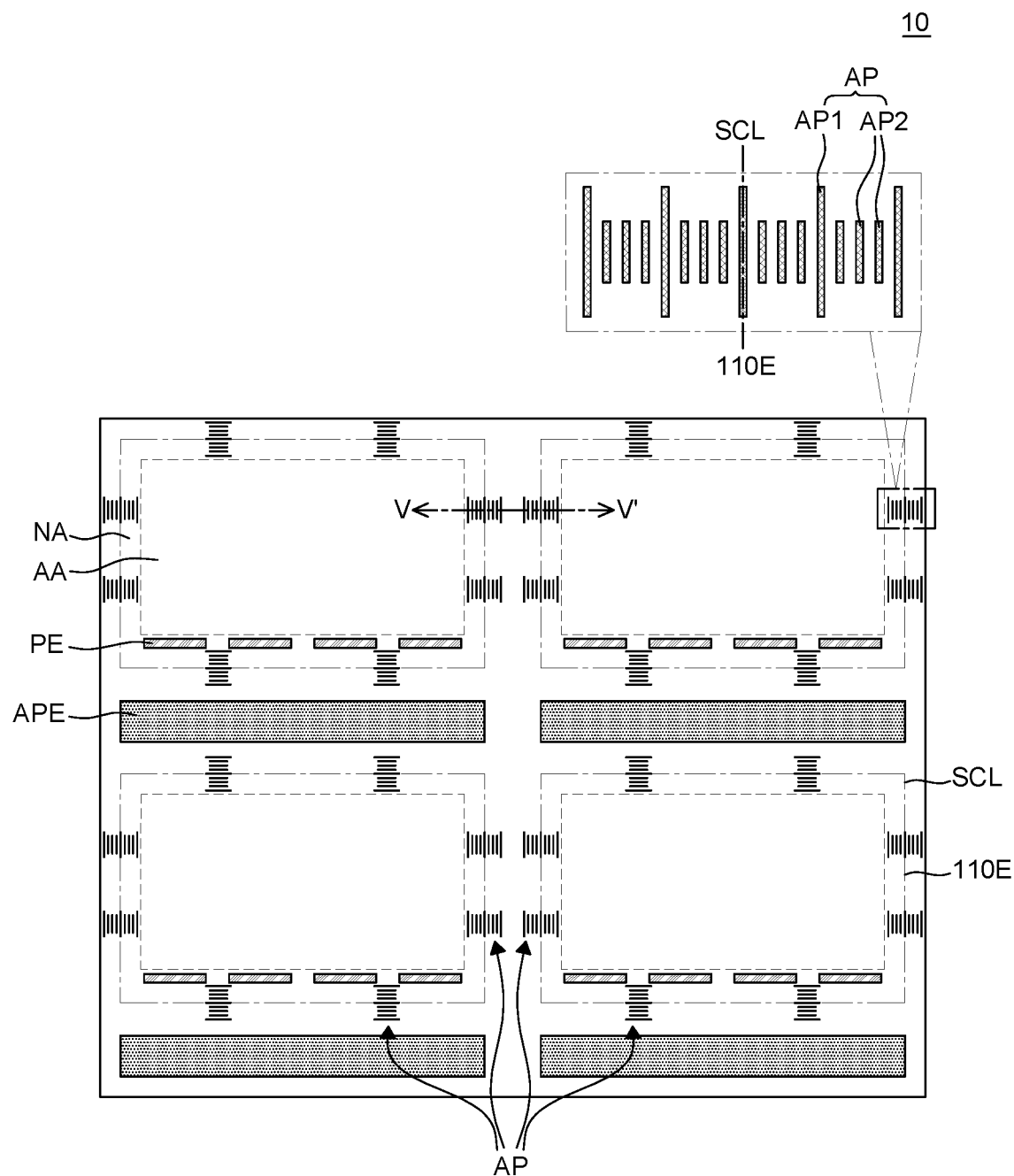
FIG. 4 is a plan view of a mother substrate for explaining a method of manufacturing the display device according to an exemplary aspect of the present disclosure.
Figure 5:
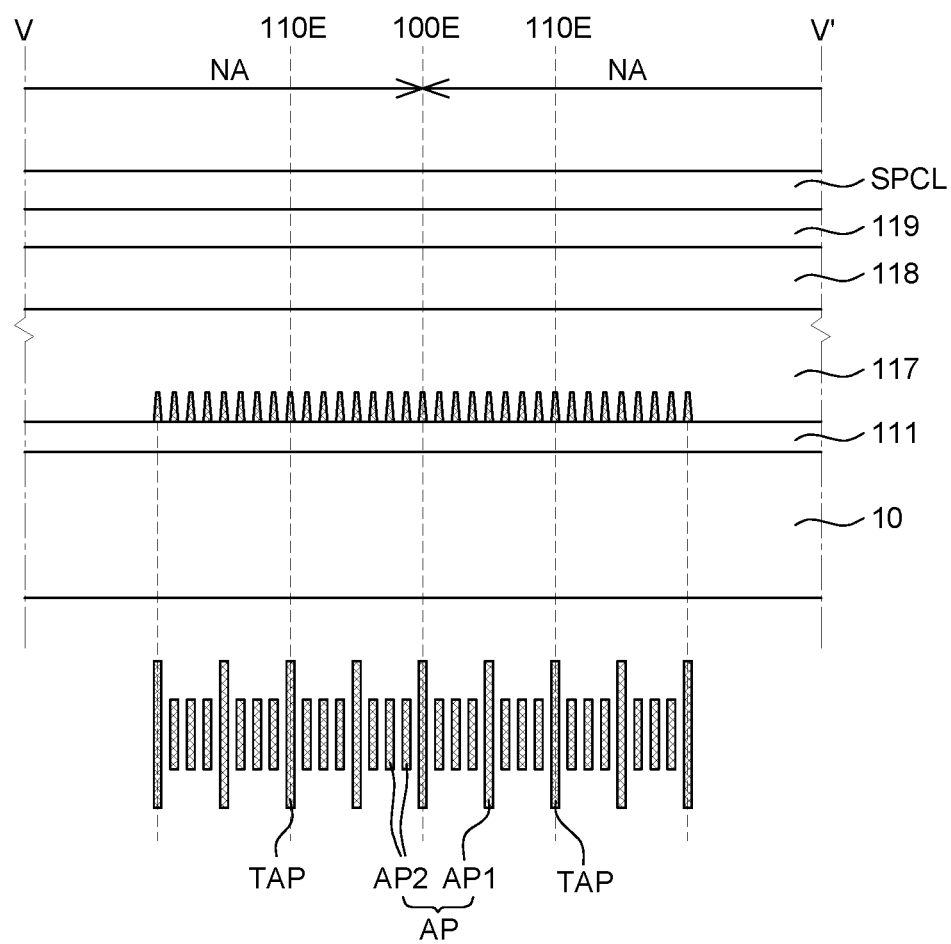
FIGS. 5 and 6 are cross-sectional views taken along V-V' of FIG. 4.
Figure 6:
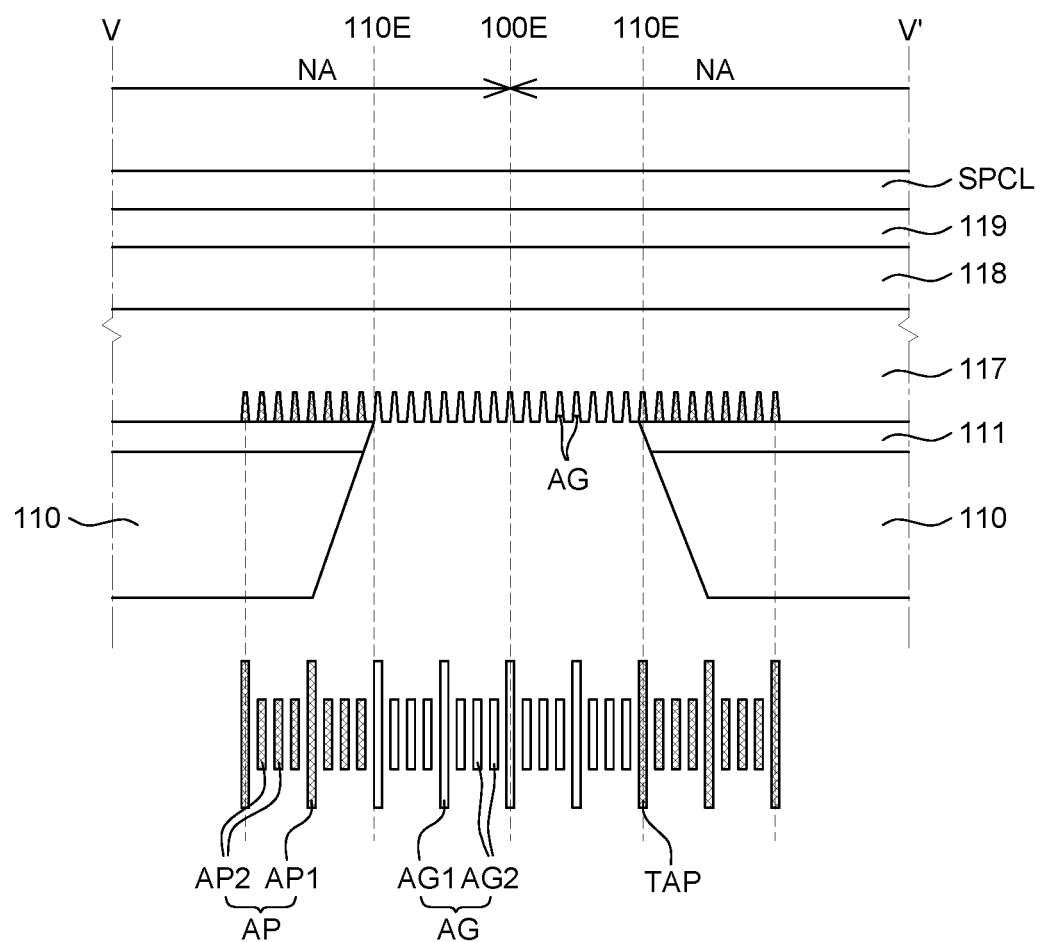

FIG. 4 is a plan view of a mother substrate for explaining a method of manufacturing the display device according to an exemplary aspect of the present disclosure. FIGS. 5 and 6 are cross-sectional views taken along V-V' of FIG. 4. Specifically, FIG. 5 is a cross-sectional view of a mother substrate 10 before an etching process, and FIG. 6 is a cross-sectional view of the mother substrate 10 after the etching process.

Referring to FIG. 4, the mother substrate 10 is a substrate for manufacturing a plurality of display devices 100 at once, and a plurality of substrates 110 may form one mother substrate 10. The mother substrate 10 may be formed of glass, similar to the substrate 110 of the display device 100. A process of manufacturing the plurality of display devices 100 may be simultaneously performed on one mother substrate 10, and then the plurality of display devices 100 may be formed at once by cutting the mother substrate 10 into a plurality of pieces. For example, after forming the first buffer layer 111 to the encapsulation layer 180 on the mother substrate 10, the mother substrate 10 may be separated into a plurality of pieces.

A plurality of inspection pad portions APE are disposed on the mother substrate 10. Each of the plurality of inspection pad portions APE may be formed to correspond to each of the plurality of display devices 100. The plurality of inspection pad portions APE are pad electrodes for inspecting whether the display devices 100 formed on the mother substrate 10 are defective or not. A lighting inspection of the sub-pixels may be performed through the plurality of inspection pad portions APE.

The plurality of inspection pad portions APE may be electrically connected to the respective pad electrodes PE of the plurality of display devices 100. When inspection signals are applied to the plurality of inspection pad portions APE, the inspection signals may be applied to the plurality of sub-pixels of the active area AA through the inspection pad portions APE and the pad electrodes PE, and whether the sub-pixels are turned on or not may be inspected. Although not shown in the drawings, inspection lines electrically connecting each of the plurality of inspection pad portions APE and the pad electrodes PE of the display device 100 may be formed.

As described above, after the process of manufacturing the display devices 100 on the mother substrate 10 is completed, the mother substrate 10 may be cut into a plurality of pieces along scribing lines SCL. In a scribing process of cutting the mother substrate 10 into a plurality of pieces, the plurality of inspection pad portions APE are separated from the substrates 110 of the display device 100, so the inspection pad portion APE does not actually remain in the display device 100.

Meanwhile, conventionally, when cutting the mother substrate 10 into a plurality of pieces, a physical method using a laser or a wheel has been used. However, when the mother substrate 10 is cut using the physical method, micro-cracks or glass fragments or the like are generated in a cut surface, thereby reducing rigidity of the substrate 110, and a grinding process to make the cut surface smooth again is further required. In addition, when the mother substrate 10 is cut through physical contact, static electricity may be generated, which may lead to damage to the display device 100.

Therefore, in the display device 100 according to an exemplary aspect of the present disclosure and the method of manufacturing the display device 100, the mother substrate 10 may be separated into the plurality of substrates 110 by a chemical method using an etchant. When the mother substrate 10 is cut by a wet etching method using an etchant, cracks or glass fragments on a cut surface may be minimized, and rigidity of the substrate 110 may be improved. Also, in the case of a cutting method using an etchant, the mother substrate 10 may be easily processed into more diverse designs such as curve or hole shapes. In addition, since the mother substrate 10 is processed while minimizing physical contact in a chemical etching method, generation of static electricity may be minimized.

Meanwhile, when the mother substrate 10 is cut using an etchant, it may be somewhat difficult to accurately control an etching line width, that is, the etching amount of the substrate 110, compared to physical etching methods. Accordingly, in the display device 100 according to an exemplary aspect of the present disclosure and the method of manufacturing the display device 100, the etching process may be controlled by forming the plurality of alignment patterns AP capable of simply measuring the position of the inside edge 110E of the substrate 110 according to the etching amount of the substrate 110 with the naked eye.

Referring to FIGS. 4 and 5 together, the plurality of alignment patterns AP may be disposed along the scribing line SCL corresponding to the inside edge 110E of the substrate 110 on the mother substrate 10. The plurality of alignment patterns AP that are disposed parallel to four sides of the substrate 110 may be disposed on each of the four sides of the substrate 110. For example, the plurality of alignment patterns AP may be disposed on both sides of the scribing line SCL corresponding to the inside edge 110E of the substrate 110. The plurality of alignment patterns AP may be disposed at regular intervals from the non-active area NA inside the scribing line SCL to an area outside the scribing line SCL. In this case, since the alignment patterns AP overlapping with the scribing line SCL correspond to the inside edge 110E of the substrate 110 that is actually designed, they may be the target alignment patterns TAP.

Referring to FIG. 6, the mother substrate 10 may be etched using an etchant. The mother substrate 10 may be etched by applying an etchant along the scribing line SCL. At this time, the mother substrate 10 and the first buffer layer 111 may be removed by the etchant, so that the plurality of alignment patterns AP may be exposed. As described above, since the plurality of alignment patterns AP are formed of an inorganic material and/or a metallic material that may be etched together with the substrate by the etchant, the plurality of alignment patterns AP that are disposed in an etched area of the substrate 110 may also be etched together. Accordingly, as shown in FIG. 6, the alignment patterns AP overlapping with an area from which the mother substrate 10 is removed may be removed to form the plurality of alignment grooves AG in the first planarization layer 117.

In this case, the etching amount of the substrate 110 and the position of the inside edge 110E of the substrate 110 may be inspected through the plurality of alignment patterns AP remaining on the substrate 110. For example, the inside edge 110E of the substrate 110 may correspond to an outermost alignment pattern AP among the plurality of alignment patterns AP that are disposed between the substrate 110 and the first planarization layer 117 and remain without being etched. In addition, the etching amount of the substrate 110 and the etching process may be controlled by comparing the outermost alignment pattern AP that is not removed during the etching process and the target alignment patterns TAP overlapping with the scribing line SCL.

When etching of the mother substrate 10 is completed, the mother substrate 10 may be separated into the plurality of display devices 100 by cutting the organic insulating layer exposed in the etched area with a laser. Since the organic insulating layer such as the first planarization layer 117 is a material that is not etched by the etchant for the substrate 110 formed of glass, it may remain as it is in an area from which the substrate 110 is removed. Thus, the organic insulating layer may be cut using a separate laser. At this time, the organic insulating layer is cut to correspond to an area outside the inside edge 110E of the substrate 110, that is, to correspond to the outside edge 100E of the display device 100 so that a residual etchant cannot penetrate into the display device 100.

Thereafter, the side coating layer 190 covering the inside edge 110E of the substrate 110 and the plurality of alignment grooves AG formed in the first planarization layer 117 may be formed to protect the outer portion of the display device 100.

Therefore, in the display device 100 according to an exemplary aspect of the present disclosure and the method of manufacturing the display device 100, the plurality of display devices 100 may be formed by cutting the mother substrate 10 formed of glass in a chemical method using an etchant. In this case, the etching process may be monitored by forming the plurality of alignment patterns AP in the scribing lines SCL and areas adjacent to the scribing lines SCL. The plurality of alignment patterns AP are disposed between the mother substrate 10 and the first planarization layer 117 and may be removed together when the mother substrate 10 is removed by the etchant. Accordingly, the plurality of alignment patterns AP overlapping areas where the mother substrate 10 is etched are removed to form the plurality of alignment grooves AG in the first planarization layer 117. The plurality of alignment patterns AP overlapping areas whether the mother substrate 10 is not etched may remain as they are. Therefore, the etching amount of the substrate 110 and the position of the inside edge 110E of the substrate 110 may be simply monitored with the naked eye by using the plurality of alignment patterns AP that are not removed in the etching process as a ruler. The etching process may be more precisely controlled.

Figure 7:
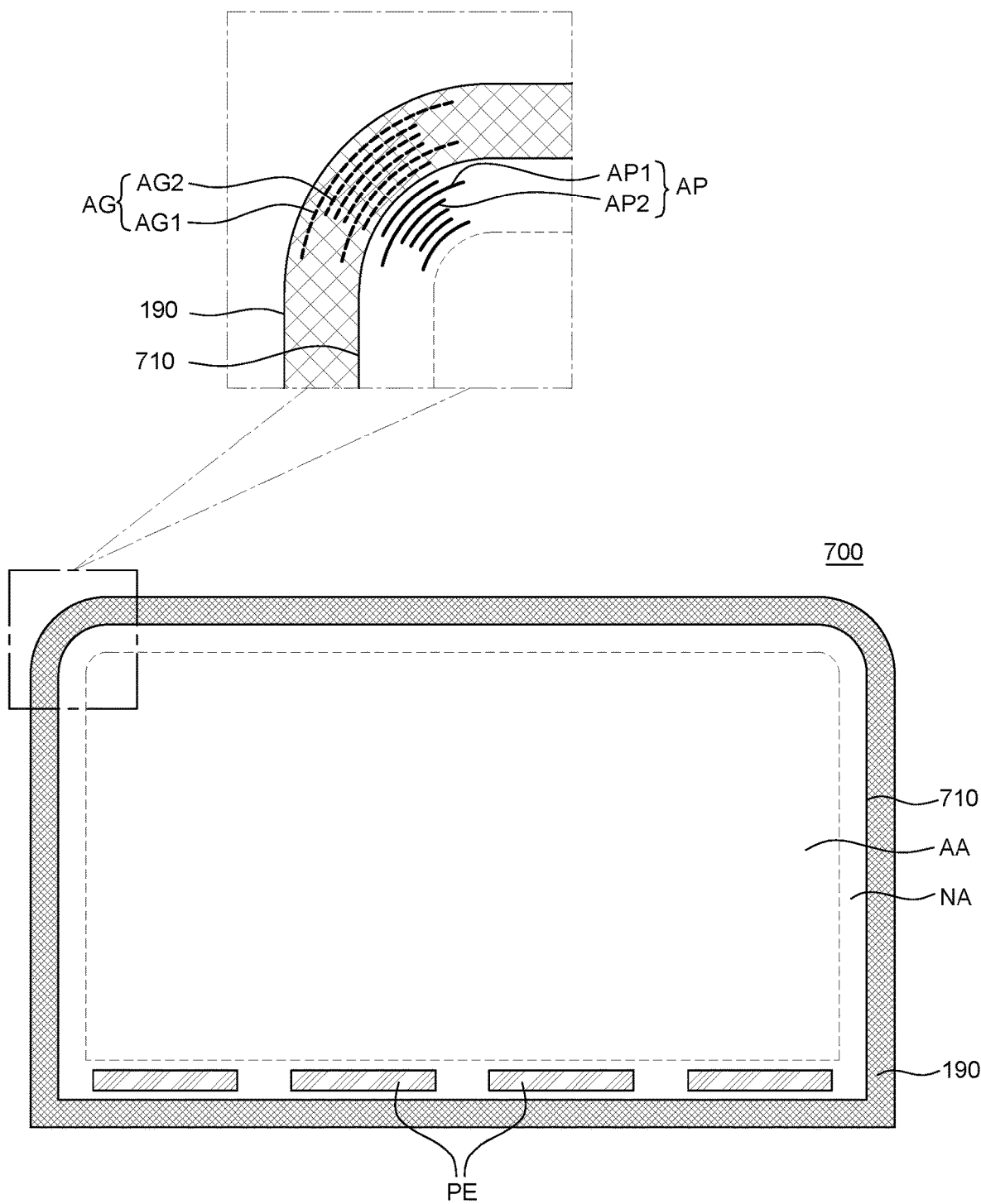
FIG. 7 is a plan view of a display device according to another exemplary aspect of the present disclosure.

FIG. 7 is a plan view of a display device according to another exemplary aspect of the present disclosure. Since other configurations of a display device 700 of FIG. 7 are substantially similar to those of the display device 100 of FIGS. 1 to 3 except for differences in shapes of a substrate 710, the plurality of alignment patterns AP, and the plurality of alignment grooves AG, redundant descriptions will be omitted.

Referring to FIG. 7, at least one of a plurality of corners of the substrate 710 may have a round shape. In addition, the round corners of the substrate 710 may also be formed through a chemical method using an etchant.

When the corner of the substrate 710 is etched in a round shape, the alignment patterns AP having round shapes may be formed to control the etching amount of the substrate 710 and a shape of the substrate 710. The plurality of alignment patterns AP disposed adjacent to the corner of the substrate 710 are configured to have round shapes. Accordingly, when the substrate 710 is etched, the corner of the substrate 710 having a round shape may be implemented based on the plurality of alignment patterns AP having round shapes.

In addition to this, the substrate 710 may be etched in various shapes using the plurality of alignment patterns AP. For example, when a circular hole is formed within the substrate 710, a plurality of circular alignment patterns AP are previously formed in an area where the circular hole is to be formed, and the substrate 710 may be etched by monitoring a size and a position of the circular hole based on the plurality of alignment patterns AP when the substrate 710 is etched.

Further, the plurality of alignment grooves AG from which the plurality of alignment patterns AP are removed are disposed in an area where the substrate 710 is etched and the side coating layer 190 is disposed. The plurality of alignment grooves AG may also have round shapes.

Accordingly, in the display device 700 according to another exemplary aspect of the present disclosure, the substrate 710 may be manufactured in various shapes by forming the alignment patterns AP having a shape corresponding to that of the substrate 710. For example, when the corner of the substrate 710 is formed in a round shape, a curvature of the corner of the substrate 710 and a size of the substrate 710 may be easily monitored during an etching process by disposing the alignment patterns AP having round shapes. Therefore, the substrate 710 may be easily formed in various shapes by forming the plurality of alignment patterns AP in shapes corresponding to a shape of an edge of the substrate 710 to be implemented, and a degree of freedom of design of the display device 700 may be improved.

The exemplary aspects of the present disclosure may also be described as follows:

A display device includes a substrate including an active area and a non-active area, an organic insulating layer disposed on the substrate and having a portion thereof protruding outward from the substrate, a plurality of alignment patterns disposed between the substrate and the organic insulating layer in the non-active area, and a plurality of alignment grooves disposed in a lower surface of the portion of the organic insulating layer, protruding outward from the substrate.

The plurality of alignment patterns and the plurality of alignment grooves may be disposed parallel to an edge of the substrate.

The substrate may include a corner having a round shape, each of the plurality of alignment patterns and the plurality of alignment grooves disposed adjacent to the corner may have a round shape.

The plurality of alignment patterns may include a plurality of first alignment patterns disposed to be spaced apart from each other at regular intervals, and a plurality of second alignment patterns disposed to be spaced apart from each other at regular intervals between the plurality of respective first alignment patterns, the plurality of first alignment patterns may have a shape different from that of the plurality of second alignment patterns.

The plurality of alignment grooves may include a plurality of first alignment grooves disposed to be spaced apart from each other at regular intervals, and a plurality of second alignment grooves disposed to be spaced apart from each other at regular intervals between the plurality of respective first alignment grooves, the plurality of first alignment grooves may have a shape different from that of the plurality of second alignment grooves.

Planar shapes of the plurality of first alignment patterns may be identical to planar shapes of the plurality of first alignment grooves, and planar shapes of the plurality of second alignment patterns may be identical to planar shapes of the plurality of second alignment grooves.

The substrate may be formed of glass, and the plurality of alignment patterns may be formed of at least one of an inorganic material and a metallic material.

The display device may further include a side coating layer covering the portion of the organic insulating layer protruding outward from the substrate and the plurality of alignment grooves.

A shape of the side coating layer filled in the plurality of alignment grooves may correspond to shapes of the plurality of alignment patterns.

A method of manufacturing a display device includes forming a plurality of alignment patterns to be adjacent to scribing lines on a mother substrate, forming an organic insulating layer covering the plurality of alignment patterns, and etching the mother substrate along the scribing lines with an etchant, the etching of the mother substrate includes etching the mother substrate and a portion of the plurality of alignment patterns together.

The portion of the plurality of alignment patterns may be etched by the etchant, and the plurality of alignment grooves may be formed in the organic insulating layer.

The method may further include forming a side coating layer covering the plurality of alignment grooves and the organic insulating layer exposed by etching the mother substrate.

The method may further include forming a plurality of display devices from the mother substrate by cutting the organic insulating layer exposed by etching the mother substrate.

It will be apparent to those skilled in the art that various modifications and variations can be made in the display device and the method of manufacturing the display device of the present disclosure without departing from the spirit or scope of the aspects. Thus, it is intended that the present disclosure covers the modifications and variations of the aspects provided they come within the scope of the appended claims and their equivalents.

What is claimed is:

1. A display device, comprising:
   a substrate including an active area and a non-active area;
   an organic insulating layer disposed on the substrate to cover the active area and the non-active area and having a portion protruding outward beyond an inside edge of the substrate toward an outside edge;
   a plurality of alignment patterns disposed between the substrate and the organic insulating layer in the non-active area; and
   a plurality of alignment grooves disposed in a lower surface of the portion of the organic insulating layer protruding outward to the outside edge of the substrate.

2. The display device of claim 1, wherein the plurality of alignment patterns and the plurality of alignment grooves are parallel to the inside edge of the substrate and the outside edge.

3. The display device of claim 1, wherein the substrate includes a corner having a round shape, and
   wherein each of the plurality of alignment patterns and the plurality of alignment grooves adjacent to the corner has a round shape.

4. The display device of claim 1, wherein the plurality of alignment patterns include,
a plurality of first alignment patterns spaced apart from each other at a regular interval; and
a plurality of second alignment patterns spaced apart from each other at a regular interval between the plurality of first alignment patterns, and
wherein the plurality of first alignment patterns have a shape different from that of the plurality of second alignment patterns.

5. The display device of claim 4, wherein the plurality of alignment grooves include,
a plurality of first alignment grooves disposed to be spaced apart from each other at a regular intervals; and
a plurality of second alignment grooves disposed to be spaced apart from each other at a regular intervals between the plurality of respective first alignment grooves,
wherein the plurality of first alignment grooves have a shape different from that of the plurality of second alignment grooves.

6. The display device of claim 5, wherein the plurality of first alignment patterns has planar shapes that are the same as planar shapes of the plurality of first alignment grooves, and the plurality of second alignment patterns has planar shapes that are the same as planar shapes of the plurality of second alignment grooves.

7. The display device of claim 1, wherein the substrate is formed of glass, and the plurality of alignment patterns are formed of at least one of an inorganic material and a metallic material.

8. The display device of claim 1, further comprising a side coating layer covering the portion of the organic insulating layer protruding outward from the substrate and the plurality of alignment grooves.

9. The display device of claim 8, wherein a shape of the side coating layer filled in the plurality of alignment grooves corresponds to shapes of the plurality of alignment patterns.

10. A method of manufacturing a display device, comprising:
forming a plurality of alignment patterns adjacent to scribing lines on a mother substrate;
forming an organic insulating layer covering the plurality of alignment patterns; and
etching the mother substrate along the scribing lines with an etchant,
wherein the etching of the mother substrate includes etching the mother substrate and a portion of the plurality of alignment patterns together.

11. The method of claim 10, wherein the portion of the plurality of alignment patterns is etched by the etchant, and a plurality of alignment grooves are formed in the organic insulating layer.

12. The method of claim 11, further comprising forming a side coating layer covering the plurality of alignment grooves and the organic insulating layer exposed by etching the mother substrate.

13. The method of claim 11, further comprising forming a plurality of display devices from the mother substrate by cutting the organic insulating layer exposed by etching the mother substrate.

14. A display device, comprising:
a substrate having at least one round shape edge and including an active area and a non-active area;
at least one organic insulating layer disposed on the substrate to cover the active area and the non-active area and having a protruding portion extending outward beyond an inside edge of the substrate toward an outside edge;
a plurality of alignment patterns disposed on the substrate at an inside edge of the substrate; and
a plurality of alignment grooves disposed in a surface of the protruding portion of the at least one organic insulating layer in close proximity to the substrate; and
a side coating layer surrounding the substrate and filled in the plurality of alignment grooves.

15. The display device of claim 14, wherein the plurality of alignment patterns and the plurality of alignment grooves are parallel to the inside and outside edges of the substrate.

16. The display device of claim 14, wherein each of the plurality of alignment patterns and the plurality of alignment grooves in the at least one round shape edge has a round shape.

17. The display device of claim 14, wherein the plurality of alignment patterns include a plurality of first alignment patterns spaced apart from each other at a regular interval and a plurality of second alignment patterns spaced apart from each other at a regular interval between the plurality of first alignment patterns, and
wherein the plurality of first alignment patterns have a length different from that of the plurality of second alignment patterns.

18. The display device of claim 17, wherein the plurality of alignment grooves include a plurality of first alignment grooves spaced apart from each other at a regular interval and a plurality of second alignment grooves spaced apart from each other at a regular interval between the plurality of first alignment grooves, and
wherein the plurality of first alignment patterns has a same shape as the plurality of first alignment grooves in a plan view, and the plurality of second alignment patterns has a same shape as the plurality of second alignment grooves in a plan view.

19. The display device of claim 14, wherein the side coating layer covers the protruding portion of the at least one organic insulating layer.

20. The display device of claim 14, wherein the substrate is a portion of a mother substrate cut along scribing lines, wherein the plurality of alignment patterns is disposed to be adjacent to scribing lines on the mother substrate.

* * * * *